United States Patent
Thomsen et al.

(10) Patent No.: US 7,893,350 B2
(45) Date of Patent: *Feb. 22, 2011

(54) LOW IRON TRANSMISSION FLOAT GLASS FOR SOLAR CELL APPLICATIONS AND METHOD OF MAKING SAME

(75) Inventors: Scott V. Thomsen, South Lyon, MI (US); Richard Hulme, Rochester Hills, MI (US); Leonid M. Landa, Brownstown, MI (US); Ksenia A. Landa, Brownstone, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/453,275

(22) Filed: May 5, 2009

(65) Prior Publication Data

US 2009/0217978 A1     Sep. 3, 2009

Related U.S. Application Data

(60) Division of application No. 11/581,784, filed on Oct. 17, 2006, now Pat. No. 7,557,053, which is a continuation-in-part of application No. 11/373,490, filed on Mar. 13, 2006.

(51) Int. Cl.
   *H01L 31/042*   (2006.01)
   *C03C 3/087*    (2006.01)
   *C03C 3/095*    (2006.01)

(52) U.S. Cl. .................... 136/256; 501/64; 501/70; 501/71

(58) Field of Classification Search .................. 501/64, 501/70, 71; 136/256
See application file for complete search history.

(56) References Cited

U.S. PATENT DOCUMENTS

| 4,510,344 A | 4/1985 | Berman |
| 4,806,436 A | 2/1989 | Tada et al. |
| 5,214,008 A | 5/1993 | Beckwith et al. |

(Continued)

FOREIGN PATENT DOCUMENTS

EP       1 116 699       7/2001

(Continued)

OTHER PUBLICATIONS

U.S. Appl. No. 11/581,784, filed Oct. 17, 2006, Thomsen et al.

(Continued)

*Primary Examiner*—Karl E Group
(74) *Attorney, Agent, or Firm*—Nixon & Vanderhye P.C.

(57) ABSTRACT

Certain example embodiments of this invention relate to a high transmission low iron glass, which is highly oxidized and made using the float process, for use in photovoltaic devices such as solar cells or the like. In certain example embodiments, the glass composition used for the glass is made via the float process using an extremely high and positive batch redox in order to reduce % FeO to a low level and permit the glass to consistently realize a combination of high visible transmission (Lta or $T_{vis}$), high infrared (IR) transmission, and high total solar (TS) transmission. The glass substrate may be patterned or not patterned in different example embodiments of this invention.

5 Claims, 3 Drawing Sheets

U.S. PATENT DOCUMENTS

| | | | |
|---|---|---|---|
| 5,964,962 A | 10/1999 | Sannomiya et al. | |
| 5,977,477 A | 11/1999 | Shiozaki | |
| 6,372,327 B1 | 4/2002 | Burnham et al. | |
| 6,403,509 B2 | 6/2002 | Cochran et al. | |
| 6,407,021 B1 | 6/2002 | Kitayama et al. | |
| 6,498,118 B1 | 12/2002 | Landa et al. | |
| 6,506,622 B1 | 1/2003 | Shiozaki | |
| 6,521,558 B2 | 2/2003 | Landa et al. | |
| 6,573,207 B2 | 6/2003 | Landa et al. | |
| 6,610,622 B1 | 8/2003 | Landa et al. | |
| 6,716,780 B2 | 4/2004 | Landa et al. | |
| 6,796,146 B2 | 9/2004 | Burnham | |
| 6,844,280 B2 * | 1/2005 | Koyama et al. | 501/70 |
| 6,949,484 B2 | 9/2005 | Landa et al. | |
| 7,030,047 B2 | 4/2006 | Landa et al. | |
| 7,037,869 B2 | 5/2006 | Landa et al. | |
| 7,144,837 B2 | 12/2006 | Landa et al. | |
| 7,169,722 B2 | 1/2007 | Landa et al. | |
| 7,557,053 B2 | 7/2009 | Thomsen et al. | |
| 2003/0114291 A1 * | 6/2003 | Koyama et al. | 501/64 |
| 2003/0125188 A1 * | 7/2003 | Koyama et al. | 501/70 |
| 2003/0199384 A1 * | 10/2003 | Landa et al. | 501/71 |
| 2004/0121896 A1 | 6/2004 | Landa et al. | |
| 2004/0180775 A1 | 9/2004 | Landa et al. | |
| 2004/0209757 A1 | 10/2004 | Landa et al. | |
| 2005/0020430 A1 | 1/2005 | Thomsen et al. | |
| 2005/0188725 A1 | 9/2005 | Tullman et al. | |
| 2006/0169316 A1 | 8/2006 | Thomsen et al. | |
| 2006/0293163 A1 | 12/2006 | Landa et al. | |
| 2007/0021289 A1 | 1/2007 | Landa et al. | |

FOREIGN PATENT DOCUMENTS

| | | |
|---|---|---|
| EP | 1 118 597 | 7/2001 |
| EP | 1 281 687 | 2/2003 |
| JP | 07-122764 | 5/1995 |
| JP | 11-60269 | 3/1999 |
| JP | 11-298030 | 10/1999 |
| WO | WO 95/13993 | 5/1995 |
| WO | WO 2004/063106 | 7/2004 |
| WO | WO 2006/083545 | 8/2006 |
| WO | WO 2006/121601 | 11/2006 |
| WO | WO 2007/106226 | 9/2007 |

OTHER PUBLICATIONS

U.S. Appl. No. 11/373,490, filed Mar. 13, 2006, Thomsen et al.

"Colored Glasses" Weyl; The Society of Glass Technology 1951, (4pgs).

"Colour Generation and Control in Glass", Bamford, Glass Science and Technology, 2, 1977 (3pgs).

"Photovoltaic Module Performance and Durability Following Long-Term Field Exposure", King et al., Sandia National Laboratories, (19pgs).

"The Redox Number Concept and Its Use by the Glass Technologist", Simpson et al., 2307 Glass Technology, vol. 19, No. 4 (Aug. 1978), pp. 82-85.

* cited by examiner

| Glass composition, wt.% | Non-solar float glasses | | STC examples for this invention | | | | |
|---|---|---|---|---|---|---|---|
| | Regular clear | ExtraClear | 1 | 2 | 3 | 4 | 5 |
| SiO2 | 71.67 | 71.61 | 71.64 | 72.12 | 71.78 | 71.69 | 71.78 |
| Al2O3 | 0.37 | 0.21 | 0.14 | 0.26 | 0.16 | 0.15 | 0.16 |
| Fe2O3 | 0.090 | 0.047 | 0.047 | 0.060 | 0.057 | 0.054 | 0.057 |
| CaO | 8.61 | 8.77 | 8.81 | 8.65 | 8.87 | 9.00 | 8.87 |
| MgO | 3.76 | 3.60 | 3.61 | 4.09 | 4.50 | 4.55 | 4.50 |
| Na2O | 13.58 | 13.70 | 13.75 | 13.81 | 14.18 | 14.17 | 14.18 |
| K2O | 0.14 | 0.06 | 0.06 | 0.12 | 0.08 | 0.04 | 0.08 |
| SO3 | 0.17 | 0.20 | 0.32 | 0.38 | 0.34 | 0.29 | 0.34 |
| TiO2 | 0.04 | 0.02 | 0.02 | 0.04 | 0.03 | 0.02 | 0.03 |
| Cr2O3 | 0.0012 | 0.0009 | 0.0008 | 0.0009 | 0.0006 | 0.0006 | 0.0006 |
| Co3O4 | 0.0000 | 0.0000 | 0.0000 | 0.0000 | 0.0000 | 0.0000 | 0.0001 |
| CeO2 | 0.0000 | 0.0000 | 0.0000 | 0.0000 | 0.0000 | 0.0060 | 0.0000 |
| Spectral properties at 4 mm | | | | | | | |
| %Tvis (LT D65) | 90.01 | 91.25 | 91.32 | 90.82 | 91.19 | 91.66 | 90.88 |
| %Tsol (ISO 9050) | 84.84 | 88.55 | 90.09 | 90.32 | 90.82 | 91.21 | 90.81 |
| %Tsol (AM 1.5 2003) | 84.64 | 88.25 | 89.94 | 90.08 | 90.57 | 90.98 | 90.53 |
| %UV (300-400) | 80.45 | 83.95 | 83.31 | 83.01 | 82.87 | 72.25 | 82.73 |
| L* (D 65 10 degr.) | 96.08 | 96.45 | 96.54 | 96.57 | 96.61 | 96.66 | 96.58 |
| a* (D 65 10 degr.) | -0.89 | -0.56 | -0.33 | -0.28 | -0.19 | -0.13 | -0.14 |
| b* (D 65 10 degr.) | 0.13 | 0.26 | 0.46 | 0.44 | 0.51 | 0.71 | 0.28 |
| %FeO (spectral) | 0.0204 | 0.0085 | 0.0036 | 0.0028 | 0.0013 | 0.0000 | 0.0013 |

LOW IRON TRANSMISSION FLOAT GLASS FOR SOLAR CELL APPLICATIONS AND METHOD OF MAKING SAME

This application is a divisional of application Ser. No. 11/581,784, filed Oct. 17, 2006 (now U.S. Pat. No. 7,557,053), which is a continuation-in-part (CIP) of Ser. No. 11/373,490, filed Mar. 13, 2006, the entire disclosures of which are hereby incorporated herein by reference in this application.

Certain example embodiments of this invention relate to a high transmission low iron glass, which is highly oxidized and made using the float process, for use in photovoltaic devices such as solar cells or the like. A method of making the glass is also provided. In certain example embodiments, the glass composition used for the glass is made via the float process using an extremely high and positive batch redox in order to reduce % FeO to a low level and permit the glass to consistently realize a combination of high visible transmission (Lta or $T_{vis}$), high infrared (IR) transmission, and high total solar (TS) transmission. The glass substrate may be patterned or not patterned in different example embodiments of this invention.

BACKGROUND AND SUMMARY OF EXAMPLE EMBODIMENTS OF THIS INVENTION

Solar cells are known in the art. A solar cell may include, for example, a photoelectric transfer film made up of one or more layers located between a pair of substrates or other layers. These layers may be supported by a glass substrate. Example solar cells are disclosed in U.S. Pat. Nos. 4,510,344, 4,806,436, 6,506,622, and 5,977,477, the disclosures of which are hereby incorporated herein by reference. Substrates in solar cells (or photovoltaic devices) are sometimes made of glass. Glass that is fairly clear in color and highly transmissive to visible light is sometimes desirable in solar cell applications.

Glass raw materials (e.g., silica sand, soda ash, dolomite, and/or limestone) typically include certain impurities such as iron, which is a colorant for glass. The total amount of iron present is expressed herein in terms of $Fe_2O_3$ in accordance with standard practice. However, typically, not all iron is in the form of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

It has been found that the use of a low-iron highly transparent (optionally patterned) glass is advantageous for solar cell applications. The use of the low-iron composition in combination with the patterned surface(s) of the glass substrate(s) has been found to be advantageous with respect to optical properties, thereby leading to increased solar efficiency of a solar cell.

In photovoltaic devices such as solar cells, it is desirable for the glass substrate on the light incident side of the device to have a high total solar (TS) transmission. The higher the total solar (TS) value, the more energy which reaches the semiconductor absorber layer of the photovoltaic device, and the more electrical energy which is generated. Thus, it will be appreciated that low % TS values are undesirable for glass substrates in photovoltaic devices, especially for such glass substrates on the light incident side of such devices. This is because it is generally desirable for the glass substrate on the light incident side of a photovoltaic device to allow as much radiation as possible to pass therethrough so that the photoelectric transfer film (or semiconductor absorbing film) of the device can convert the radiation to as much electrical energy as possible. The less radiation allowed to pass through the glass substrate, the less current generated in the photovoltaic device. For example, the conventional high transmission clear glasses "Regular clear" and "ExtraClear" set forth at the left-hand portion of FIG. 1 have undesirably low % TS values of 84.84% and 88.55% (ISO 9050), respectively.

Figure 1:
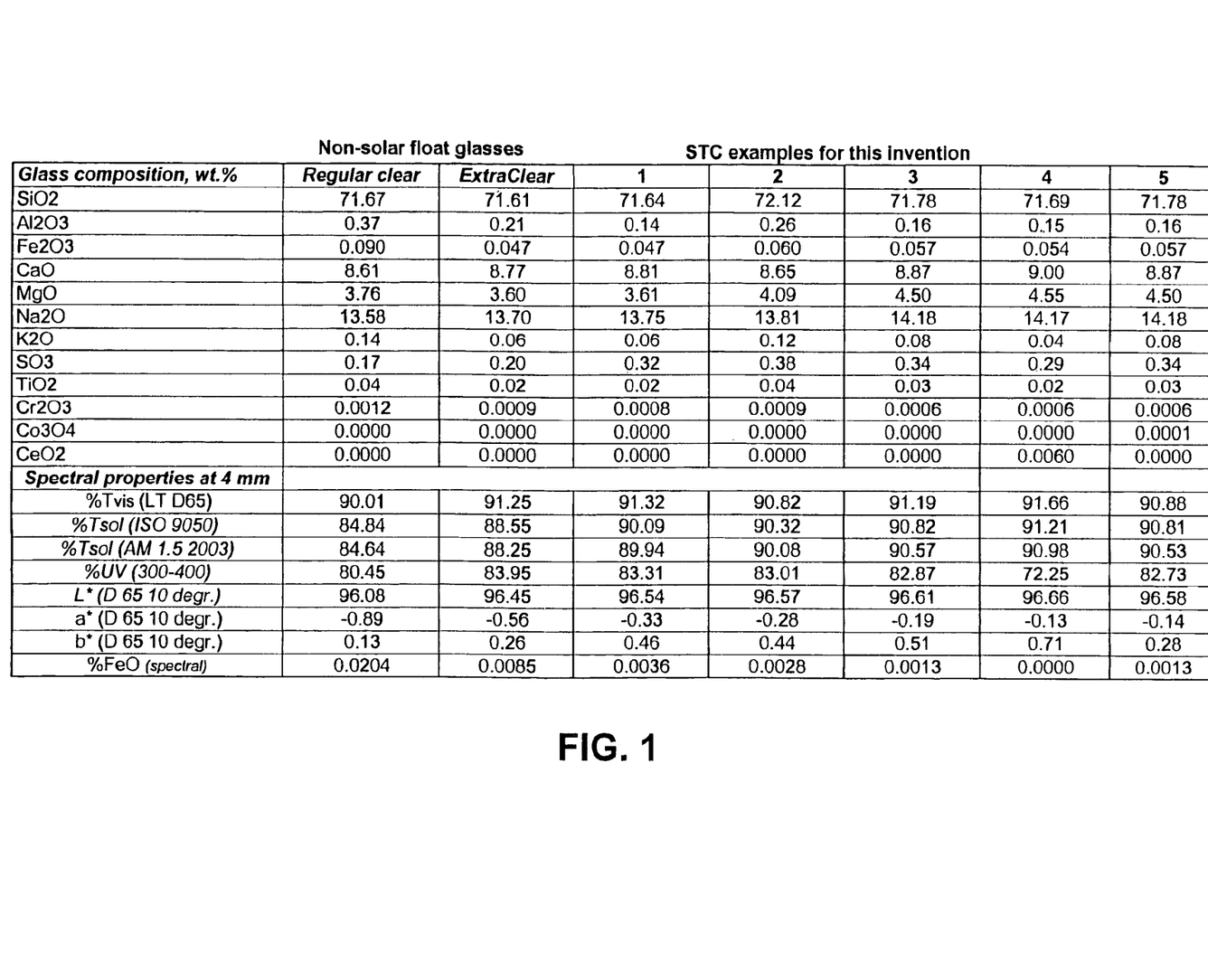
FIG. 1 is a table setting forth the chemical compositions and spectral properties of glasses according to certain example embodiments of this invention (Examples 1-5) compared to conventional "Regular clear" and "ExtraClear" glasses.

It would be desirable if a high transmission clear glass could be provided so as to have a higher % TS value than the 84-88% TS Values of the conventional "Regular clear" and "ExtraClear" glasses set forth at the left-hand portion of FIG. 1.

It has been found that ferrous iron ($Fe^{2+}$; FeO) is of particular concern when seeking to maximize % TS values of glass. This is because the ferrous iron blocks significant amounts of IR radiation and some visible radiation, each of which substantially contribute to % TS. Thus, high % FeO content can lead to undesirably low % TS values in photovoltaic applications and the like.

In the past, antimony (Sb) has been used in glass in an attempt to reduce % FeO in glass and achieve good characteristics. In certain instances, antimony has been added to the glass in the form of antimony trioxide ($Sb_2O_3$), sodium antimonite ($NaSbO_3$), and/or sodium pyroantimonate (Sb ($Sb_2O_5$)). However, it has been found that antimony is undesirable in certain example instances in that it incompatible with certain float processes (e.g., tin bath). Thus, in certain example embodiments of this invention, the highly oxidized glass is achieved without the need for antimony (which includes antimony oxide), although trace amounts may be present in certain instances.

Another approach to reducing % FeO in a high transmission glass has been to use cerium oxide ($CeO_2$) in the glass. However, the use of substantial amounts of cerium oxide ($CeO_2$) in high transmission glass is undesirable because cerium oxide is both expensive and can lead to undesirable coloration in certain example instances.

One or more of the aforesaid problems may be solved using one or more of the example embodiments of this invention.

In certain example embodiments of this invention, a glass is made so as to be highly transmissive to visible light, to be fairly clear or neutral in color, and to consistently realize high % TS values. High % TS values are particularly desirable for photovoltaic device applications in that high % TS values of the light-incident-side glass substrate permit such photovoltaic devices to generate more electrical energy from incident radiation since more radiation is permitted to reach the semiconductor absorbing film of the device. It has been found that the use of an extremely high batch redox in the glass manufacturing process permits resulting low-ferrous glasses made via the float process to consistently realize a desirable combination of high visible transmission, substantially neutral color, and high total solar (% TS) values. Moreover, in certain example embodiments of this invention, this technique permits these desirable features to be achieved with the use of little or no cerium oxide.

In certain example embodiments of this invention, a soda-lime-silica based glass is made using the float process with an extremely high batch redox. An example batch redox which may be used in making glasses according to certain example embodiments of this invention is from about +26 to +40, more preferably from about +27 to +35, and most preferably from about +28 to +33 (note that these are extremely high batch redox values not typically used in making glass). In making the glass via the float process or the like, the high batch redox value tends to reduce or eliminate the presence of ferrous iron ($Fe^{2+}$; FeO) in the resulting glass, thereby permitting the glass to have a higher % TS transmission value which may be beneficial in photovoltaic applications. This is advantageous, for example, in that it permits high transmission, neutral color, high % TS glass to be made using raw materials having typical amounts of iron in certain example instances (e.g., from about 0.04 to 0.10% total iron).

In certain example embodiments of this invention, the glass has a total iron content ($Fe_2O_3$) of no more than about 0.1%, more preferably from about 0 (or 0.04) to 0.1%, even more preferably from about 0.01 (or 0.04) to 0.08%, and most preferably from about 0.03 (or 0.04) to 0.07%. In certain example embodiments of this invention, the resulting glass may have a % FeO (ferrous iron) of from 0 to 0.0050%, more preferably from 0 to 0.0040, even more preferably from 0 to 0.0030, still more preferably from 0 to 0.0020, and most preferably from 0 to 0.0010, and possibly from 0.0005 to 0.0010 in certain example instances. In certain example embodiments, the resulting glass has a glass redox (different than batch redox) of no greater than 0.08, more preferably no greater than 0.06, still more preferably no greater than 0.04, and even more preferably no greater than 0.03 or 0.02.

The glass substrate may be patterned, or not patterned, in different example embodiments of this invention.

In certain example embodiments, the glass substrate may have fairly clear color that may be slightly yellowish (a positive b* value is indicative of yellowish color), in addition to high visible transmission and high % TS. For example, in certain example embodiments, the glass substrate may be characterized by a visible transmission of at least about 90% (more preferably at least about 91%), a total solar (% TS) value of at least about 90% (more preferably at least about 91%), a transmissive a* color value of from −1.0 to +1.0 (more preferably from −0.5 to +0.5, even more preferably from −0.35 to 0), and a transmissive b* color value of from −0.5 to +1.5 (more preferably from 0 to +1.0, and most preferably from +0.2 to +0.8). These properties may be realized at an example non-limiting reference glass thickness of about 4 mm.

In certain example embodiments of this invention, there is provided a method of making glass comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.1% |
| % FeO | 0 to 0.005 | wherein the glass has visible transmission of at least about 90%, a transmissive a* color value of −1.0 to +1.0, a transmissive b* color value of from −0.50 to +1.5, % TS of at least 89.5%, and wherein the method comprises using a batch redox of from +26 to +40 in making the glass.

In certain example embodiments of this invention, there is provided a glass comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | <=0.1% |
| % FeO | <=0.005 |
| glass redox | <=0.08 |
| antimony oxide | 0 to less than 0.01% |
| cerium oxide | 0 to 0.07% | wherein the glass has visible transmission of at least 90%, TS transmission of at least 90%; a transmissive a* color value of −1.0 to +1.0, a transmissive b* color value of from −0.5 to +1.5.

In still further example embodiments of this invention, there is provided solar cell comprising: a glass substrate; first and second conductive layers with at least a photoelectric film provided therebetween; wherein the glass substrate is of a composition comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | <=0.1% |
| % FeO | <=0.005 |
| glass redox | <=0.08 |
| antimony oxide | 0 to less than 0.01% |
| cerium oxide | 0 to 0.07% | wherein the glass substrate has visible transmission of at least 90%, TS transmission of at least 90%; a transmissive a* color value of −1.0 to +1.0, a transmissive b* color value of from −0.5 to +1.5.

DETAILED DESCRIPTION OF CERTAIN EXAMPLE EMBODIMENTS OF THIS INVENTION

Figure 3:
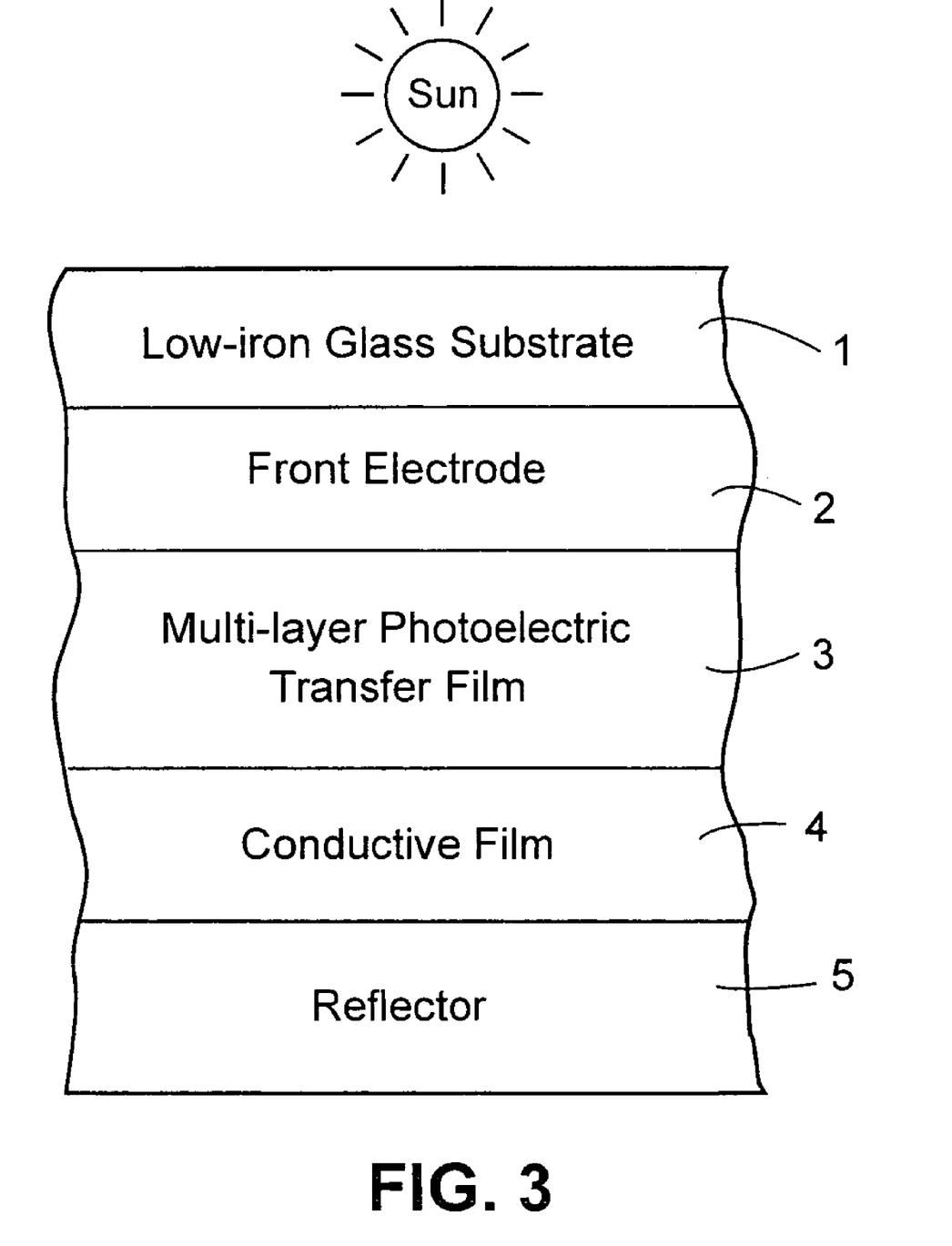
FIG. 3 is a cross sectional view of a photovoltaic device using a glass substrate according to an example embodiment of this invention.

An example solar cell is illustrated in cross section in FIG. 3. The solar cell (photovoltaic and/or thermal) includes, for example and without limitation, high transmission glass substrate 1, transparent conductive front electrode 2 which may be a transparent conductive oxide film in certain example instances, a photoelectric transfer film (sometimes referred to as a semiconductor absorber film) 3 which may include one or more layers, a rear or back electrode 4, and an optional reflector 5. In certain example embodiments, the photoelectric transfer film 3 may include a p-type silicon inclusive layer, an i-type silicon inclusive layer, and an n-type silicon inclusive layer. These silicon inclusive layers may be composed of amorphous silicon or any other suitable type of semiconductor with suitable dopants in certain example embodiments of this invention. Other semiconductors may instead be used for the active photoelectric film 3 that converts incident radiation to electric current. The electrodes 2, 4 may be of a transparent conductor such as conductive zinc oxide, or any other suitable material in certain example embodiments of this invention, and the optional reflector 5 may be of aluminum, silver or the like.

In certain example embodiments of this invention, one or both major surfaces of the glass substrate 1 may be patterned. Light tends to be refracted at interface(s) resulting from the patterning of the glass substrate 1, thereby causing light to proceed through the semiconductor layer(s) at an angle(s) such that the path is longer. As a result, more light can be absorbed by the solar cell and output current and/or efficiency can be improved/increased. In certain example embodiments of this invention, the patterned surface(s) of the glass substrate 1 may have a surface roughness (between peaks/valleys) of from about 0.1 to 1.5 µm, more preferably from about 0.5 to 1.5 µm. In certain example embodiments of this invention, the glass substrate 1 has one or more surfaces which are patterned so as to have a waviness feature defined therein. However, in other example embodiments of this invention, the glass substrate 1 need not be patterned.

In certain example embodiments of this invention, the glass for substrate 1 comprises soda-lime-silica based glass made via the float process, or any other suitable process. In addition to base composition/glass, a colorant portion may be provided. It is desired for the glass to be fairly clear in color, have a high visible transmission, and a high total solar (% TS) transmission so as to let as much radiation as possible therethrough to reach the photoelectric transfer film 3 of the photovoltaic device. An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

In addition to the base glass (e.g., see Table 1 above), in making glass according to certain example embodiments of the instant invention the glass batch includes materials (including colorants and/or oxidizers) which cause the resulting glass to be fairly neutral in color (it may be slightly yellow in certain example embodiments, indicated by a slightly positive b* value), realize a high visible light transmission and a high % TS. These materials may either be present in the raw materials (e.g., small amounts of iron), or may be added to the base glass materials in the batch (e.g., oxidizers). Moreover, in addition to the ingredients in Table 1 above, other minor ingredients, including various conventional refining aids, such as $SO_3$ and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO. Moreover, from about 0.15 to 7% MgO, more preferably from about 1 to 7% MgO, is provided in the glass in certain example embodiments.

In certain example embodiments of this invention, the glass of substrate 1 is soda-lime-silica based (see base glass above) and is based on low iron raw materials such that the glass has a total iron ($Fe_2O_3$) content, in terms of wt. %, of no more than about 0.01%. In certain example embodiments of this invention, the glass has a total iron content ($Fe_2O_3$) of no more than about 0.1%, more preferably from about 0 (or 0.04) to 0.1%, even more preferably from about 0.01 (or 0.04) to 0.08%, and most preferably from about 0.03 (or 0.04) to 0.07%. In certain example embodiments of this invention, the resulting glass may have a % FeO (ferrous iron) of from 0 to 0.0050%, more preferably from 0 to 0.0040, even more preferably from 0 to 0.0030, still more preferably from 0 to 0.0020, and most preferably from 0 to 0.0010, and possibly from 0.0005 to 0.0010 in certain example instances. In certain example embodiments, the resulting glass has a glass redox (different than batch redox) of no greater than 0.08, more preferably no greater than 0.06, still more preferably no greater than 0.04, and even more preferably no greater than 0.03 or 0.02. Moreover, in certain example embodiments of this invention, the glass is extremely oxidized so as to have no or very little ferrous ($Fe^{2+}$; FeO) as discussed above. This low % FeO, in combination with other features, permits the glass to have a higher % TS transmission in combination with fairly neutral color and high visible transmission, which are beneficial in solar cell applications.

In certain example embodiments of this invention, the glass is made so as to be highly transmissive to visible light, to be fairly clear or neutral in color, and to consistently realize high % TS values. High % TS values are particularly desirable for photovoltaic device applications in that high % TS values of the light-incident-side glass substrate permit such photovoltaic devices to generate more electrical energy from incident radiation since more radiation is permitted to reach the semiconductor absorbing film of the device. It has been found that the use of an extremely high batch redox in the glass manufacturing process permits resulting low-ferrous glasses made via the float process to consistently realize a desirable combination of high visible transmission, substantially neutral color, and high total solar (% TS) values. Moreover, in certain example embodiments of this invention, this technique permits these desirable features to be achieved with the use of little or no cerium oxide, antimony, and/or arsenic. In certain example embodiments of this invention, a soda-lime-silica based glass is made using the float process with an extremely high batch redox. An example batch redox which may be used in making glasses according to certain example embodiments of this invention is from about +26 to +40, more preferably from about +27 to +35, and most preferably from about +28 to +33 (note that these are extremely high batch redox values not typically used in making glass). In making the glass via the float process or the like, the high batch redox value tends to reduce or eliminate the presence of ferrous iron ($Fe^{2+}$; FeO) in the resulting glass, thereby permitting the glass to have a higher % TS transmission value which may be beneficial in photovoltaic applications. These high batch redox values may be realized by adding sufficient oxidizers to the glass batch during the float manufacturing process so as to cause the batch redox to reach these levels. In certain example embodiments of this invention, high oxidation and thus high positive batch redox may be achieved through the use of a combination of sufficient amounts of sulfates such as salt cake, Epsom salt, gypsum and/or nitrates such as sodium and/or potassium nitrates (individually or in combination). In particular, sufficient oxidizing agent(s) are used in the glass batch to cause one or both of: (a) the glass batch to have a batch redox of from about +26 to +40 (more preferably from about +27 to +35, and most preferably from about +28 to +33), and/or (b) the resulting glass to have a glass redox ($FeO/Fe_2O_3$) of no greater than 0.08, more preferably no greater than 0.06, still more preferably no greater than 0.04, and even more preferably no greater than 0.03 or 0.02. This technique of using the batch redox in such a manner is advantageous, for example, in that it permits high transmission, neutral color, high % TS glass to be made using raw materials having typical amounts of iron in certain example instances (e.g., from about 0.04 to 0.10% total iron, or even from 0.05 to 0.10% total iron).

In the past, antimony (Sb) has been used in glass in an attempt to oxidize the glass and achieve good characteristics. For instances, in certain instances, antimony was added to the glass in the form of antimony trioxide ($Sb_2O_3$), sodium antimonite ($NaSbO_3$), and/or sodium pyroantimonate (Sb ($Sb_2O_5$)). However, it has been found that antimony is undesirable in certain example instances in that it incompatible with certain float processes (e.g., tin bath) in certain instances. Thus, in certain example embodiments of this invention, the highly oxidized glass is achieved without the need for antimony (which includes antimony oxide). In certain example embodiments of this invention, the glass is free of antimony (which includes antimony oxide), or the glass has less than 0.01% antimony, more preferably no more than about 0.005% antimony, even more preferably no more than about 0.0005%, or 0.0001%, antimony, and still more preferably no antimony. In a similar manner, in certain example embodiments of this invention, the highly oxidized glass is achieved without the need for arsenic (which includes arsenic oxide) which, like Sb, tends to cause discoloration of cerium-doped glass. In certain example embodiments of this invention, the glass is free of arsenic (As) (which includes arsenic oxide), or the glass has less than 0.01% arsenic, more preferably no more than about 0.005% arsenic, even more preferably no more than about 0.0005%, or 0.0001%, arsenic, and still more preferably no arsenic.

In certain preferred embodiments, there is no or very little cerium oxide in the glass. Cerium oxide is a UV absorber, and thus prevents UV from being transmitted through the glass. Thus, too much cerium oxide is not desired in certain solar cell embodiments of this invention. Accordingly, in certain example embodiments of this invention, the glass has no more than about 0.07% or 0.05% cerium oxide, more preferably no more than about 0.01% cerium oxide, more preferably no more than about 0.001% cerium oxide, still more preferably no more than about 0.0005% cerium oxide, and sometimes 0% cerium oxide. However, it will be appreciated that it is possible to use a small amount of cerium oxide for oxidizing purposes. As with all material percentages herein, these amounts are in terms of wt. %. The term cerium oxide as used herein includes $Ce_2O_3$, $CeO_2$, or the like.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm, more preferably no more than 1 ppm, and possibly as low as 0 ppm of the element or material. It is noted that small amounts of titanium oxide may be included in certain instances. Moreover, it is possible to use small amounts of cobalt oxide, erbium oxide and/or $Nd_2O_3$ in the glass batch, and thus also in the glass, for color correction purposes to cause the glass to be more neutral in color.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color. As mentioned above, deep oxidation in certain example embodiments of this invention may be achieved by operations adjustments and chemically by introduction of sulfates in the form of one or more of salt cake (e.g., $Na_2SO_4$), Epsom salt (e.g., $MgSO_4 \times 7H_2O$) and/or gypsum in significant amounts and combination of one or more of these with potassium and/or sodium nitrate. The salt cake may be referred to in the final glass as $SO_3$. The high amounts of salt cake used in certain example embodiments, can be seen from the large amounts of $SO_3$ mentioned herein with respect to the final glass composition (e.g., see Examples 1-5 in FIG. 1).

It is noted that batch redox is different than glass redox. Batch redox is known in the art as being generally based on the following. Each component of the batch is assigned a redox number, and the batch redox is calculated as the sum total of the same. The batch redox number is calculated before the glass is made, from the batch. A detailed discussion of "batch redox" and how it is determined is provided in *The redox number concept and its use by the glass technologist*, W. Simpson and D. D. Myers (1977 or 1978), which is incorporated herein by reference. In contrast with batch redox, glass redox is calculated after the glass has been made from spectral data or the like, and is a ratio of % FeO to total iron in the glass. The high batch redox discussed above causes iron in the ferrous state ($Fe^{2+}$; FeO) to oxidize to the ferric state ($Fe^{3+}$) and thus causes an amount of the strong blue-green colorant of ferrous iron ($Fe^{2+}$; FeO) to oxidize into the weaker yellow-green ferric iron colorant ($Fe^{3+}$) during the glass melt (note: some ferrous state iron may remain in the resulting glass). The aforesaid oxidation of the iron tends to reduce coloration of the glass, reduces % FeO, and causes visible transmission and % TS to increase. Any yellowish color caused by oxidation of iron into ferric state ($Fe^{3+}$) iron (i.e., positive b*) may be acceptable in solar cell applications and need not be compensated for by addition of other colorants thereby saving cost in certain example embodiments of this invention.

It will be appreciated by those skilled in the art that the high batch redox results in a glass with a lower "glass redox" value (i.e., less iron in the ferrous state FeO). In this regard, the proportion of the total iron in the ferrous state (FeO) is used to determine the redox state of the glass, and glass redox is expressed as the ratio $FeO/Fe_2O_3$, which is the weight percentage (%) of iron in the ferrous state (FeO) divided by the weight percentage (%) of total iron (expressed as $Fe_2O_3$) in the resulting glass. Due to at least the presence of the oxidizing agent(s), the glass redox of glass 1 according to certain example embodiments of this invention is very low as mentioned above, and the amount of iron in the ferrous state (FeO) will also be low.

It is noted that glass according to certain example embodiments of this invention is often made via the known float process in which a tin bath is utilized. It will thus be appreciated by those skilled in the art that as a result of forming the glass on molten tin in certain exemplary embodiments, small amounts of tin or tin oxide may migrate into surface areas of the glass on the side that was in contact with the tin bath during manufacture (i.e., typically, float glass may have a tin oxide concentration of 0.05% or more (wt.) in the first few microns below the surface that was in contact with the tin bath).

In view of the above, glasses according to certain example embodiments of this invention achieve a neutral or substantially clear color, high visible transmission, high IR transmission, and high total solar (TS) transmission. In certain embodiments, resulting glasses according to certain example embodiments of this invention may be characterized by one or more of the following transmissive optical, composition, or color characteristics (for the optics, an example non-limiting reference thickness of about 4 mm is used). Note that Lta is visible transmission %. It is noted that in the table below the L*, a* and b* color values are determined per Ill. D65, 10 degree Obs.

achieved, which is advantageous for solar cell applications in that more radiation is permitted through the glass substrate 1 so that it can be converted to current or voltage. This may be achieved through the provision of the unique batch redox values used and/or the material combinations described herein.

Examples 1-5

Example glasses (e.g., for glass substrate 1) were made and tested according to example embodiments of this invention, as shown in FIG. 1. In particular, the five right-most columns in FIG. 1 illustrate the respective compositions and optical characteristics of the glasses of Examples 1-5 of this invention. For purposes of comparison, conventional "Regular clear" and "ExtraClear" glasses and their characteristics are also provided at the left-hand portion of FIG. 1. It can be seen from FIG. 1 that the Examples of this invention had improved (i.e., higher) total solar (TS) and reduced % FeO compared to the conventional "Regular clear" and "ExtraClear" glasses. In this regard, note the additional $SO_3$ in the Examples 1-5 compared to the conventional glasses, which indicates the presence of higher quantities of oxidizers in the batch and a higher batch redox, and thus reduced FeO % compared to the conventional glasses. It is noted that Examples 1-5 all had 0% antimony and 0% arsenic, which is what is preferred in certain example embodiments of this invention. Moreover, in making Examples 1-5, no reducing agents were present in the batch. Still further, it is noted that Examples 1-3 and 5 used no cerium oxide, whereas Example 4 used a small amount of cerium oxide to cause % FeO to go to essentially zero.

Figure 2:
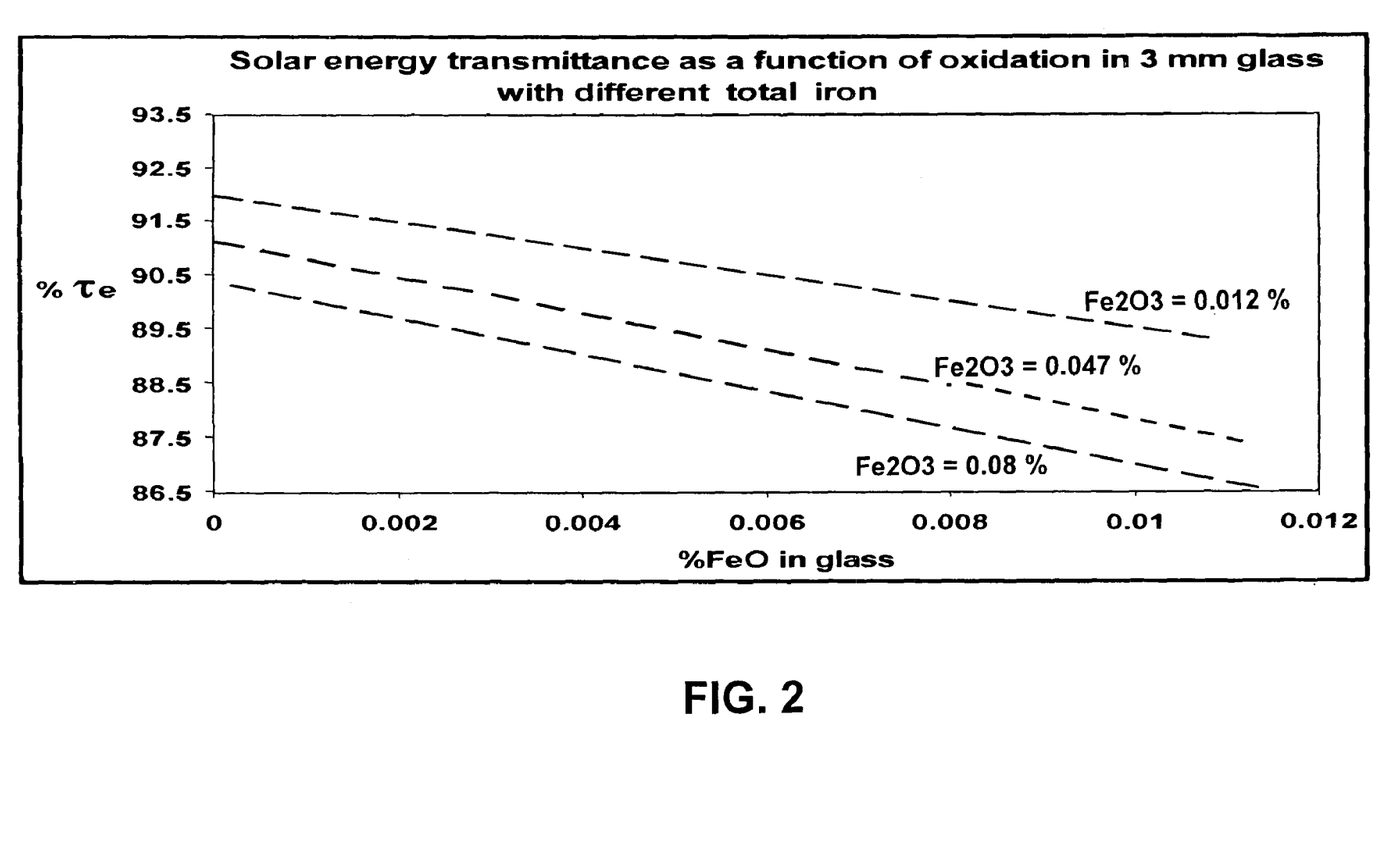
FIG. 2 is % TS (or % Te) versus % FeO in glass graph illustrating how a reduction in % FeO in a high transmission glass can lead to an increased % TS value.

FIG. 2 is a solar energy vs. % FeO graph comparing the transmission characteristics of glasses according to different examples of this invention with different total iron and % FeO amounts. It can be seen in FIG. 2 that reduced % FeO content

TABLE 2

GLASS CHARACTERISTICS OF EXAMPLE EMBODIMENTS

| Characteristic | General | More Preferred | Most Preferred |
|---|---|---|---|
| Lta (Lt D65): | >=90% | >=91% | >=91.5% |
| % TS (ISO 9050): | >=89.5% | >=90% | >=91% |
| % IR | >=80% | >=85% | >=90% (or >=91%) |
| % UV (300-400 nm): | >=70% | >=75% | >=80% |
| total iron ($Fe_2O_3$): | <=0.1% | 0.01-0.08% | 0.04-0.07% |
| % FeO (wt. %): | <=0.005% | <=0.004% | <=0.003% (or 0.002%) |
| Glass Redox: | <=0.08 | <=0.06 | <=0.04 or 0.03 |
| Batch Redox: | +26 to +40 | +27 to +35 | +28 to +33 |
| $SO_3$ | >=0.27 | 0.30 to 0.50 | >=0.32 (or >=0.34) |
| L* (Ill. D65, 10 deg.): | 90-99 | 94-99 | 95-98 |
| a* (Ill. D65, 10 deg.): | −1.0 to +1.0 | −0.5 to +0.5 | −0.25 to 0.0 |
| b* (Ill. D65, 10 deg.): | −0.5 to +1.5 | +0.1 to +0.8 | +0.2 to +0.6 |

The aforesaid characteristics of the glass substrate 1 are for the glass substrate alone, not the overall solar cell or solar cell module.

As can be seen from Table 2 above, glasses for substrate 1 of certain embodiments of this invention achieve desired features of fairly clear color and/or high visible transmission, with slightly positive b* color in certain embodiments, while not requiring iron to be eliminated from the glass composition. Moreover, high % IR and high % TS values are also translates into increased total solar energy transmittance, and that reduced total iron content also translates into higher total solar energy transmittance.

Once given the above disclosure many other features, modifications and improvements will become apparent to the skilled artisan. Such features, modifications and improvements are therefore considered to be a part of this invention, the scope of which is to be determined by the following claims:

What is claimed is:

1. A solar cell comprising:
    a glass substrate;
    first and second conductive layers with at least a photoelectric film provided therebetween;
    wherein a composition of the glass substrate comprises:

| Ingredient | wt. % |
|---|---|
| $SiO_2$ | 67-75% |
| $Na_2O$ | 10-20% |
| CaO | 5-15% |
| total iron (expressed as $Fe_2O_3$) | <=0.1% |
| % FeO | <=0.005 |
| glass redox | <=0.08 |
| antimony oxide | 0 to less than 0.01% |
| cobalt oxide | 0% |
| cerium oxide | 0% | wherein the glass substrate has visible transmission of at least 90%, TS transmission of at least 90%; a transmissive a* color value of −1.0 to +1.0, a transmissive b* color value of from −0.5 to +1.5.

2. The solar cell of claim 1, wherein the glass substrate comprises:

| % FeO | <=0.003% |
|---|---|
| glass redox | <=0.06. |

3. The solar cell of claim 1, wherein the glass substrate has a % TS of at least 91% and comprises:

| % FeO | <=0.002% |
|---|---|
| glass redox | <=0.04. |

4. The solar cell of claim 1, wherein the glass substrate comprises from 0.30 to 0.50% $SO_3$.

5. The solar cell of claim 1, wherein the glass substrate contains no more than 2 ppm of at least four of: erbium oxide, nickel oxide, neodymium oxide, chromium oxide, and selenium.

* * * * *